United States Patent
Lee et al.

(10) Patent No.: US 6,600,228 B2
(45) Date of Patent: Jul. 29, 2003

(54) KEYHOLE AT THE TOP METAL LEVEL PREFILLED WITH PHOTORESIST TO PREVENT PASSIVATION DAMAGE EVEN FOR A SEVERE TOP METAL RULE

(75) Inventors: Yu-Hua Lee, Hsinchu (TW); Min-Hsiung Chiang, Taipei (TW); Jenn Ming Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 37 days.

(21) Appl. No.: 09/929,676

(22) Filed: Aug. 15, 2001

(65) Prior Publication Data

US 2002/0004310 A1 Jan. 10, 2002

Related U.S. Application Data

(62) Division of application No. 09/200,589, filed on Nov. 27, 1998, now Pat. No. 6,294,456.

(51) Int. Cl.⁷ .................. H01L 21/4763; H01L 21/56
(52) U.S. Cl. .................. 257/758; 257/774; 257/759; 257/760; 257/637; 257/641; 257/300; 257/306; 257/311; 257/330; 257/700; 257/701
(58) Field of Search .................. 438/625, 623; 257/300, 306, 311, 330, 758–760, 700–701

(56) References Cited

U.S. PATENT DOCUMENTS 4,778,739 A    10/1988  Protschka ............... 430/30
5,068,711 A *  11/1991  Mise
5,567,660 A    10/1996  Chen et al. ............. 437/231
5,665,657 A     9/1997  Lee ....................... 438/624
5,670,384 A *   9/1997  Needham ................ 216/26
6,030,706 A *   2/2000  Eissa et al. ............ 174/258
6,143,644 A *  11/2000  Chen et al. ............. 438/622
6,207,546 B1 *  3/2001  Chen et al. ............. 438/612
6,445,072 B1 *  9/2002  Subramanian et al. .... 257/758
2002/0175146 A1 * 11/2002 Dokumaci et al. ......... 216/88

* cited by examiner

Primary Examiner—Alexander O. Williams
(74) Attorney, Agent, or Firm—George O. Saile; Stephen B. Ackerman; Graham S. Jones, II

(57) ABSTRACT

A planarized surface of a photoresist layer is formed above a layer formed over a hole in a blanket, conformal, silicon nitride layer which in turn is formed above a keyhole in metallization with SOG layers therebetween on the surface of a semiconductor device. A blanket, first photoresist layer was formed above the blanket silicon nitride to fill the damage to the surface caused by the hole. Then the first photoresist layer was stripped leaving a residual portion of the first photoresist layer filling the hole. Next, a blanket, second photoresist layer was formed above the blanket layer. The hole has a neck with a width from about 200 Å to about 500 Å and the hole has a deep, pocket-like gap with a cross-section with a width from about 500 Å to about 1200 Å below the narrow neck.

6 Claims, 2 Drawing Sheets

KEYHOLE AT THE TOP METAL LEVEL PREFILLED WITH PHOTORESIST TO PREVENT PASSIVATION DAMAGE EVEN FOR A SEVERE TOP METAL RULE

This is a division of patent application Ser. No. 09/200,589, filing date Nov. 27, 1998, now U.S. Pat. No. 6,294,456 Method Of Prefilling Of Keyhole At The Top Metal Level With Photoresist To Prevent Passivation Damage Even For A Severe Top Metal Rule And Device Manufactured Thereby, assigned to the same assignee as the present invention.

BACKGROUND OF THE INVENTION

1. Field of the Invention

This invention relates to the top metallization layer of a semiconductor memory device and more particularly to planarization of a passivation layer thereover.

2. Description of Related Art

In the backend process of manufacture of Enhanced Embedded DRAM (EDRAM) devices, we have found the passivation damage at a particular position. After gradually tracing the problem, the SOG gap-filling of passivation layer is the main issue and it causes the worst photoresist profile, therefore, the passivation damage is induced during etching of the passivation layer. We have concluded that the passivation damage results from a pocket or void which causes poor gap-filling above the SOG in the pocket regions. After passivation with a photoresist coating we have found by scanning with a alpha-stepper that the photoresist profile is not as flat and smooth as we anticipated. The poor gap filling is due to the density of metal lines which are formed in an array. The use of a thicker SOG layer did not help.

We have found that passivation damage is not avoidable for mask-sets for 0.35 EDRAM devices, (0.6 $\mu$m/0.6 $\mu$m) by using a current passivation scheme which is as follows:

Form M4—Fourth level Metallization

Form 15,000 Å SiON (PE SiON)

Deposit 3,000 Å SOG (Spin-On-Glass)

Form 10,000 Å SiN (Silicon Nitride)

Using such a process, the SOG layer is absorbed completely by the improper layout pattern (~4000 $\mu$m comb-meander) at the edge of a die. This permits or causes the photoresist to flow into the gap in a succeeding photoresist processing step which involves a soft bake. Thus there is damage during the passivation etch due to poor SOG planarization.

U.S. Pat. No. 4,778,739 of Protschka for "Photoresist Process for Reactive Ion Etching of Metal Patterns for Semiconductor Devices" shows a photoresist rework process for metal lines.

U.S. Pat. No. 5,665,657 of Lee for "Spin-On-Glass Partial Etchback Planarization Process" shows a method for forming a planarization SOG layer which eliminates voids in SOG layers in between closely spaced conductive lines, employing an etch back process.

U.S. Pat. No. 5,567,660 of Chen et al. for "Spin-On-Glass Planarization by a New Stagnant Coating Method" shows a gap fill method to fill gaps between metal lines which method differs from the present invention.

SUMMARY OF THE INVENTION

This invention adds a second photoresist step over a silicon nitride layer over a metallization (e.g., M4) layer.

Passivation damage is avoided everywhere including even a severe top metal rule with a about a 4000 $\mu$m comb-meander for an 8,000 Å metal height.

The result of the process of this invention is gap-filling and more particularly planarization of the passivation layer thereover.

In accordance with this invention, a method is provided for planarizing a surface of a photoresist layer formed above a layer formed over a gap in a blanket silicon nitride layer which in turn is formed above a keyhole in metallization with SOG layers therebetween on the surface of a semiconductor device.

The method includes the following steps.

Form a blanket, first photoresist layer above the blanket silicon nitride with a damaged surface caused by the gap in the silicon nitride layer.

Strip the first photoresist layer leaving a residual portion of the first photoresist layer in the gap.

Then, form a blanket, second photoresist layer above the blanket layer.

Preferably, the gap has a neck with a width of from about 200 Å to about 500 Å and the gap has a deep, pocket-like cross-section with a width from about 500 Å to about 1,200 Å below the narrow neck, and the partial stripping of the first photoresist layer is performed by an etching process including wet and dry processing.

In accordance with another aspect of the invention, a method is provided for planarizing a surface of a photoresist layer is formed above a layer formed over a gap in a blanket silicon nitride layer which in turn is formed above a keyhole in metallization with SOG layers therebetween on the surface of a semiconductor device, comprising the following steps.

Form a blanket, first photoresist layer above the blanket silicon nitride with a damaged surface caused by the gap.

Strip the first photoresist layer leaving a residual portion of the first photoresist layer in the gap, and Form a blanket, second photoresist layer above the blanket layer.

Preferably, in either aspect of the method of this invention, the partial stripping of the first photoresist layer is performed by an etching process. Preferably wet and dry processing is used in the etching process.

In accordance with still another aspect of this invention, a semiconductor device is covered with a blanket silicon nitride layer with a gap therein above a keyhole in metallization of the device. A gap filling first photoresist layer has been formed in the gap above the blanket layer with a damaged surface caused by the gap etched back to leave the first photoresist layer in the gap. A blanket, second photoresist layer is formed above the blanket layer. The first photoresist layer is coated on the silicon nitride and subjected to a soft bake prior to formation of the second photoresist layer which had been formed by coating, soft baking, exposure, developing and a hard baking.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
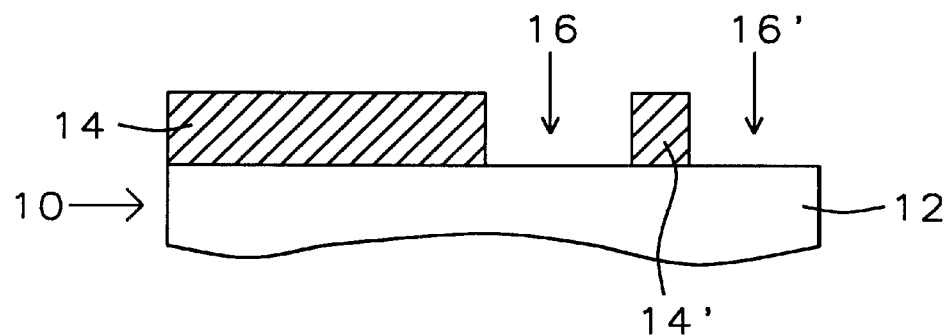
FIG. 1 shows a thin film memory device with a planar layer upon which is formed a top metallization layer patterned into a wide portion and a narrow tooth with a keyhole between the wide portion and narrow tooth and another opening to the right of narrow tooth.

FIG. 1 shows a thin film memory device 10 with a planar substrate layer 12 (composed of a material such as a dielectric) upon which is formed a top (M4) metallization layer (composed of a material selected from titanium nitride (TiN), tungsten (W), and aluminum copper (AlCu) with a thickness from about 6,000 Å to about 10,000 Å, which has been patterned into a wide planar metallization (M4) portion 14 and a narrow metallization (M4) tooth 14' to the right of the wide portion 14. There is a keyhole 16 between the wide portion 14 and narrow tooth 14' and another opening 16' to the right of narrow tooth 14'.

Figure 2:
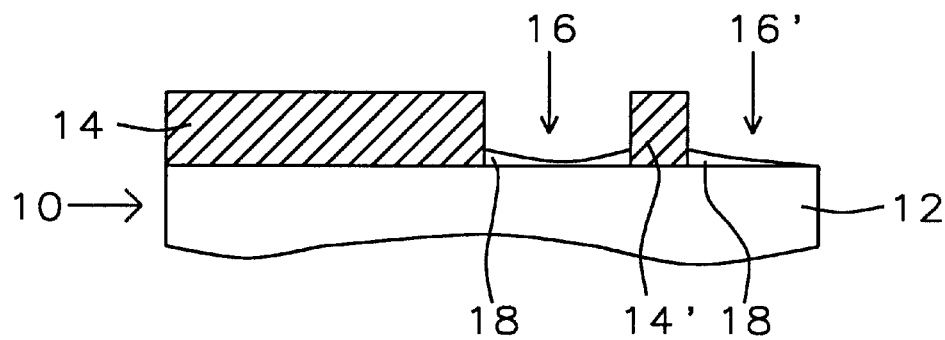
FIG. 2 shows the device of FIG. 1 after addition of a SOG layer filling the base of the keyhole and the bottom of opening covering the exposed surface of the substrate layer well below the top of the metallization portion and the top of the narrow tooth.

FIG. 2 shows the device 10 of FIG. 1 after addition of a SOG layer 18 filling the base of the keyhole 16 and the bottom of opening 16', covering the exposed surface of layer 12 to a thickness from about 500 Å to about 1500 Å. Thus, the SOG layer 18 is well below the top of the metallization portion 14 and the top of the narrow tooth 14'.

Figure 3:
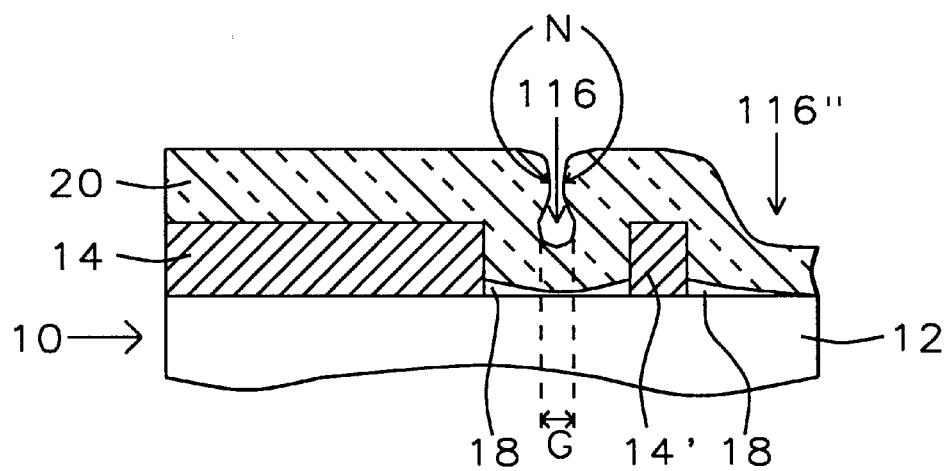
FIG. 3 shows the device of FIG. 2 after formation of a silicon nitride layer filling the keyhole further and the opening, covering the exposed surface of the SOG layer with a blanket silicon nitride layer. A deep, narrow hole is formed above the keyhole.

FIG. 3 shows the device 10 of FIG. 2 after formation of a silicon nitride passivation layer 20 which has a thickness from about 8,000 Å to about 12,000 Å. Passivation layer 20 fills the keyhole 16 further and also fills the opening 16', where it covers the exposed surface of SOG layer 18. Thus, the SOG layer 18 and the metallization portion/tooth 14/14' are covered by a conformal, blanket silicon nitride passivation layer 20. A deep, narrow hole 116 is formed above keyhole 16 and a wider hole 116" is formed above opening 16'. The dimensions of the deep, narrow hole 116 over keyhole 16 are an upper narrow neck N and a wide gap G that is deeper, below the narrow neck N. Narrow neck N has a width from about 200 Å to about 500 Å. Wide gap G has a deep, pocket-like cross-section with a width from about 500 Å to about 1,200 Å below the narrow neck N.

Figure 4:
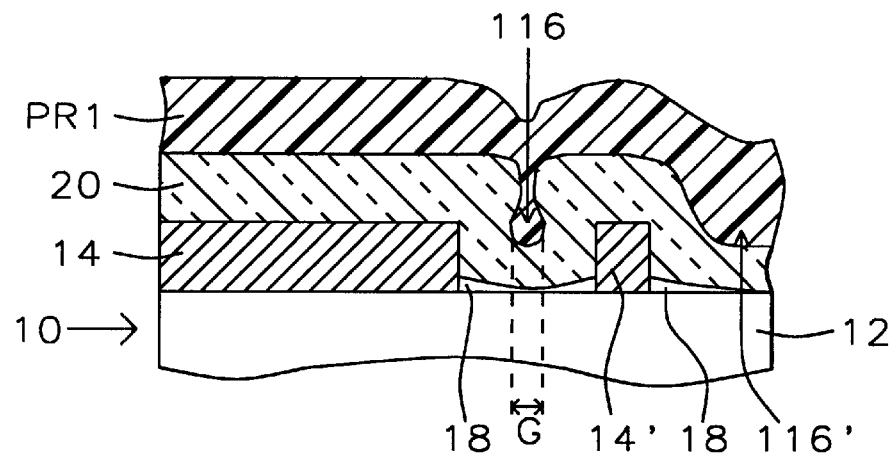
FIG. 4 shows the device of FIG. 3 after formation of a first, blanket, photoresist layer filling the narrow hole leaving a relatively sharp depression above the narrow hole, which is caused by the gap below the narrow neck. This results in a thinning-of the photoresist layer at the site of the depression. This thinning is great enough to comprise damage which damages the effect of the passivation provided by the photoresist layer.

FIG. 4 shows the device 10 of FIG. 3 after formation of a first, blanket, photoresist layer PR1 with a thickness from about 0.7 μm to about 3.5 μm. First, blanket, photoresist layer PR1 fills the narrow hole 116 and wider hole 116" leaving a relatively sharp depression of from about 1.5 μm to about 3.5 μm above narrow hole 116, which is caused by the gap G below narrow neck N. This results in a thinning of the photoresist layer PR1 at the site of the depression. This thinning is great enough to comprise damage which damages the effect of the passivation provided by the photoresist layer PR1.

Figure 5:
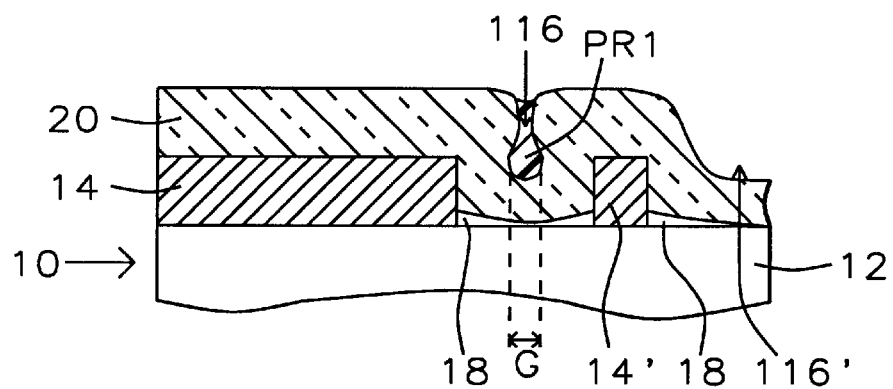
FIG. 5 shows the device of FIG. 4 after the first photoresist layer has been stripped in a wet and dry etching process with some residue of photoresist layer remaining in the key-hole filling the gap up into the neck, but the remainder of the top surface of silicon nitride layer is now exposed.

FIG. 5 shows the device 10 of FIG. 4 after first photoresist layer PR1 has been stripped in a wet and dry etching process with some residue of photoresist layer PR1 remaining in the key-hole 116 filling the gap G up into the neck N, but the remainder of the top surface of silicon nitride layer 20 is now exposed.

Figure 6:
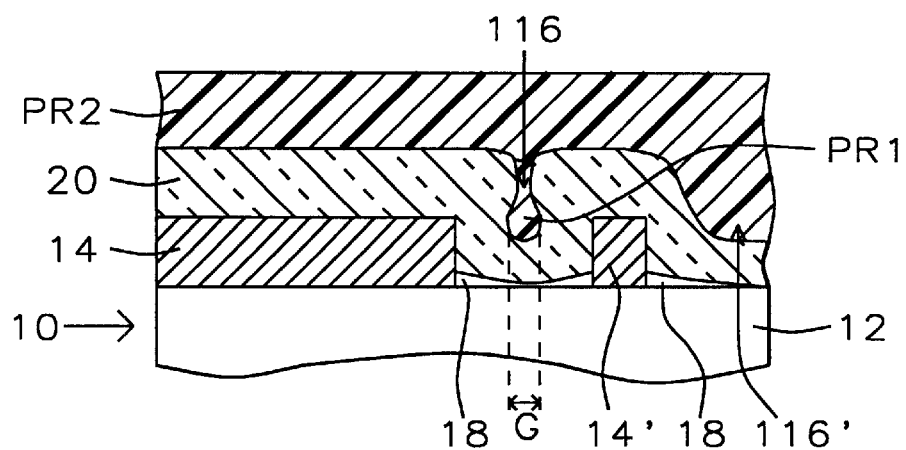
FIG. 6 shows the device of FIG. 5 after formation of a second blanket photoresist layer covering the surface of the silicon nitride layer and the remaining portion of the photoresist layer which substantially fills the gap up into the neck. The result is gap-filling and more particularly planarization of the passivation layer thereover.

FIG. 6 shows the device 10 of FIG. 5 after formation of a second blanket photoresist layer PR2 with a thickness from about 2.5 μm to about 3.5 μm covering the surface of silicon nitride layer 20 and the remaining portion of photoresist layer PR1 which substantially fills the gap G with resist PR1 reaching up into the neck N. Inspection of the results of the second photoresist step shows substantially no resist filling into key-hole as evidenced by OM (Optical Microscopy) inspection. Thus, passivation damage is avoided, i.e. the device is free from such damage. The result is that the gap is filled and more particularly planarization of the passivation layer thereover has been achieved.

There is a soft bake step next. The "second photoresist layer" (PR2) includes a photoresist (PR) coating, soft bake, exposure, developing and a hard bake; but the "first photoresist layer" (PR1) includes a photoresist (PR) coating and soft bake.

Next, the passivation bubble is removed by a PSC $O_2$ plasma etcher just after alloying to remove photoresist by means of a plasma dry etch.

The passivation bubble is photoresist (PR) remaining after passivation of the photoresist (PR) which will become a bubble during passivation alloying of the metal layer and the contact. Only the remainder of the photoresist layer PR1 in the gap G will become the passivation bubble.

Summary of Process

1. A first photoresist coating fills the key-hole induced by not enough SOG filling.
2. Strip the first photoresist coating with a wet and dry process leaving some photoresist residue in the key-hole.
3. Then coat the device in a second photoresist step (actually passivation photolithography) with no substantial photoresist filling into key-hole as determined by OM (Optical Microscopy) inspection, so passivation damage is thus avoided after subsequent passivation etching due to the good photoresist planarization, i.e. the device is free of such damage.
4. Remove the passivation bubble by PSC or plasma etching just after alloying.

While this invention has been described in terms of the above specific embodiments), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A planarized semiconductor device, comprising:
    a thin glass layer filling only the base of a keyhole formed between portions of metallization formed over a surface of the semiconductor device,
    a conformal blanket layer of silicon nitride passivation material covering the metallization, the keyhole and the thin glass layer in the keyhole having a deep narrow hole with an upper narrow neck and a pocket-like gap with a greater width that is located deeper below the narrow neck, the hole having been filled with a first photoresist layer formed above the blanket layer filling the gap and having been etched back to leave the first photoresist layer in the gap, and a blanket, second photoresist layer formed above the blanket layer.

2. A device in accordance with claim 1 wherein the hole has a neck with a width from about 200 Å to about 500 Å and the gap has a deep, pocket-like cross-section with a width from about 500 Å to about 1,200 Å below the narrow neck.

3. A planarized surface comprising:

a layer of metallization formed over a surface of the semiconductor device with a keyhole therein, a thin glass layer filling only the base of the keyhole formed located only well below the top of the metallization between portions of metallization formed over a surface of the semiconductor device, a conformal blanket layer of silicon nitride passivation material covering the metallization, the keyhole and the thin glass layer in the keyhole having a deep narrow hole with an upper narrow neck and a pocket-like gap with a greater width that is located deeper below the narrow neck, a first photoresist layer formed above the thin glass layer formed only in the keyhole over the deep narrow hole in the blanket silicon nitride passivation layer which in turn is formed above a key-hole in metallization with the thin glass therebetween on the surface of a semiconductor device, and a blanket, second photoresist layer formed above the blanket layer.

4. A device in accordance with claim 3 wherein:

the hole has a neck with a width from about 200 Å to about 500 Å and the gap has a deep, pocket-like cross-section with a width from about 500 Å to about 1,200 Å below the narrow neck.

5. A device in accordance with claim 3 wherein:

the first photoresist layer was soft baked prior to formation of the second photoresist layer, and the second photoresist layer having been formed coated, soft baked, exposed, developed and hard baked.

6. A device in accordance with claim 3 wherein:

the hole has a neck with a width from about 200 Å to about 500 Å and the gap has a deep, pocket-like cross-section with a width from about 500 Å to about 1,200 Å below the narrow neck, the first photoresist layer was coated on the silicon nitride and having been soft baked prior to formation of the second photoresist layer, and the second photoresist layer having been formed coated, soft baked, exposed, developed and hard baked.

* * * * *